United States Patent [19]

Cheney et al.

[11] Patent Number: 5,276,808
[45] Date of Patent: Jan. 4, 1994

[54] DATA STORAGE BUFFER SYSTEM AND METHOD

[75] Inventors: Dennis P. Cheney, Vestal; Robert J. Yagley, Jr., Endicott; Mark J. Wolski, Vestal; Andrew E. Petruski, Endicott; Josephine A. Boston, Wappingers Falls, all of N.Y.

[73] Assignee: International Business Machines Corporation, Armonk, N.Y.

[21] Appl. No.: 650,566

[22] Filed: Feb. 4, 1991

[51] Int. Cl.⁵ .................. G06F 13/38; G06F 12/02
[52] U.S. Cl. .................. 395/250; 395/275; 395/325; 364/239; 364/240; 364/243; 364/DIG. 1; 365/230.03
[58] Field of Search ........... 364/DIG.; 395/425, 250, 395/650, 325, 275; 340/825; 365/230.03, 230.02; 370/85.1

[56] References Cited

U.S. PATENT DOCUMENTS

| | | | |
|---|---|---|---|
| 3,896,417 | 7/1975 | Beecham | 395/250 |
| 4,071,887 | 1/1978 | Daley et al. | 364/200 |
| 4,078,254 | 3/1978 | Beausoleil et al. | 364/900 |
| 4,408,181 | 10/1983 | Nakayama | 82/61 |
| 4,463,421 | 7/1984 | Laws | 395/325 |
| 4,510,581 | 4/1985 | Cohen | 364/900 |
| 4,747,038 | 5/1988 | Bradley et al. | 395/250 |
| 4,807,184 | 2/1989 | Sheler | 364/900 |
| 4,860,244 | 8/1989 | Bruckert et al. | 364/900 |
| 4,866,601 | 9/1989 | DuLac et al. | 395/700 |
| 4,903,240 | 2/1990 | Von Flue | 365/189.02 |
| 4,956,771 | 9/1990 | Neustaedter | 364/200 |
| 4,991,084 | 2/1991 | Rodiger et al. | 364/200 |
| 5,089,951 | 2/1992 | Iijima | 395/275 |

OTHER PUBLICATIONS

Abstracts from Assignee Search of Patents Assigned to Storage Technology Corporation (Search Conducted Oct. 23, 1990).

Primary Examiner—Michael R. Fleming
Assistant Examiner—Gopal C. Ray
Attorney, Agent, or Firm—Sterne, Kessler, Goldstein & Fox

[57] ABSTRACT

A system and method for striping data to multiple storage devices is provided. One embodiment of the present invention sequentially gates data to a plurality of buffers, wherein only those buffers corresponding to storage devices in use are induced to gate in data. The data is then sent to the storage devices in parallel. Other embodiments further include the use of striping buffers alternatingly used to gate in data, and transfer data to the storage devices.

11 Claims, 9 Drawing Sheets

*Fig. 1*

PRIOR ART

Fig. 2

PRIOR ART

|  | | CYCLE 1 | | | | CYCLE 2 | | |
|---|---|---|---|---|---|---|---|---|
| STRIPER CHIP: | | A | B | C | D | A | B | C | D |
| REG. 1 — | | 0 | 1 | 2 | 3 | 4 | 5 | 6 | 7 |
| REG. 2 — | | 8 | 9 | 10 | 11 | 12 | 13 | 14 | 15 |
| REG. 3 — | | 16 | 17 | 18 | 19 | 20 | 21 | 22 | 23 |
| REG. 4 — | | 24 | 25 | 26 | 27 | 28 | 29 | 30 | 31 |
| REG. 5 — | | 32 | 33 | 34 | 35 | 36 | 37 | 38 | 39 |
| REG. 6 — | | 40 | 41 | 42 | 43 | 44 | 45 | 46 | 47 |
| REG. 7 — | | 48 | 49 | 50 | 51 | 52 | 53 | 54 | 55 |
| REG. 8 — | | 56 | 57 | 58 | 59 | 60 | 61 | 62 | 63 |
| REG. 9 — | | XX | XX | XX | XX | XX | XX | XX | XX |

8 STORAGE DEVICES USED

*Fig. 9A*

|  | | CYCLE 1 | | | | CYCLE 2 | | |
|---|---|---|---|---|---|---|---|---|
| STRIPER CHIP: | | A | B | C | D | A | B | C | D |
| REG. 1 — | | 0 | 1 | 2 | 3 | 4 | 5 | 6 | 7 |
| REG. 2 — | | 8 | 9 | 10 | 11 | 12 | 13 | 14 | 15 |
| REG. 3 — | | 16 | 17 | 18 | 19 | 20 | 21 | 22 | 23 |
| REG. 4 — | | 24 | 25 | 26 | 27 | 28 | 29 | 30 | 31 |
| REG. 5 — | | 32 | 33 | 34 | 35 | 36 | 37 | 38 | 39 |
| REG. 6 — | | 40 | 41 | 42 | 43 | 44 | 45 | 46 | 47 |
| REG. 7 — | | 48 | 49 | 50 | 51 | 52 | 53 | 54 | 55 |
| REG. 8 — | | 56 | 57 | 58 | 59 | 60 | 61 | 62 | 63 |
| REG. 9 — | | 64 | 65 | 66 | 67 | 68 | 69 | 70 | 71 |

9 STORAGE DEVICES USED

*Fig. 9B*

DATA STORAGE BUFFER SYSTEM AND METHOD

BACKGROUND OF THE INVENTION

I. Field of the Invention

The present invention is a system and method for striping data to multiple storage devices. More specifically, this invention relates to a system and method for striping data to a variable number of storage devices, such that parity generation can be facilitated, and such that a minimal amount of buffering is used.

II. Related Approaches

In recent years, there has been an enormous increase in the speed and general capabilities of computers. This has been driven largely by the desires of people to solve larger and more complex problems. In view of the size of some of these problems and the amounts of raw data that they require, the speed and power of computer peripherals such as mass-storage devices has become very important in order to take full advantage of a powerful computer.

The speed of mass-storage devices has traditionally lagged significantly behind the speed of state-of-the-art computers. This is largely due to the fact that, unlike the computational portion of a computer (referred to as the "host computer"), mass-storage devices contain moving parts. Consequently, there is a continuing need for faster data storage devices which can effectively work in conjunction with today's high speed computers.

At any given point in time, state-of-the-art storage devices are capable of some finite rate of throughput. Thus, the effective speed of the host is often limited in certain respects to whatever this rate of throughput happens to be. In addition, state-of-the-art storage devices tend to be very expensive.

To help alleviate these problems, the concept of integrally connected multiple storage devices was developed. This concept is described further with regard to FIG. 1.

Figure 1:
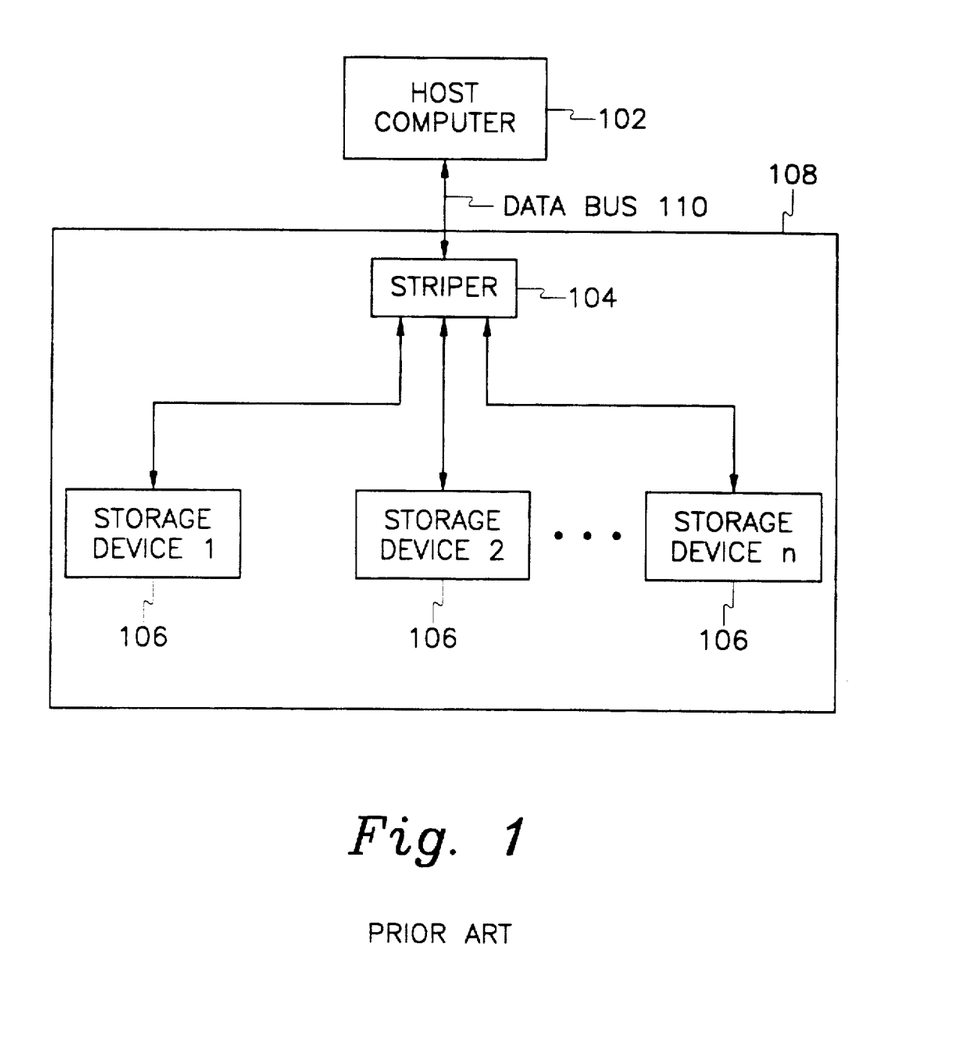
FIG. 1 is a block diagram of a storage facility having multiple storage devices.

Referring now to FIG. 1, a storage facility 108 is shown to comprise a striper 104 and n storage devices 106. When the storage facility 108 receives data from a host computer 102 via a data bus 110 for storage (that is, a data "write" is requested), the data is received by the striper 104 before being sent to the storage devices 106. The striper 104 divides this data into sections. These sections might be, for example, one byte in length, where the width of the data bus is, for example, one byte wide. Once divided, the sections are then sent to the storage devices 106.

As a further explanation of the above-noted concept, the first byte of data from the host computer 102 would be sent by the striper 104 to storage device 1. The next byte would be sent to storage device 2, and so on, until the $n^{th}$ byte is sent to storage device n. The $n^{th} + 1$ byte is then sent to storage device 1, and the process repeats itself. Each of the n bytes (and multiples thereof) is called a "stripe."

A striper should be fast enough to accommodate the throughput of the data sent by the host. This typically requires the use of a striper containing at least one relatively large data receptacle.

In addition to merely striping data to multiple storage devices, the abilities of today's computers and storage devices require that a striper also be efficient and flexible. For example, the number of storage devices 106 used in a given situation may vary. Consequently, the striper 104 should accommodate a variable number of storage devices 106.

Another feature that a striper should have is the ability to send data to the multiple storage devices so as to facilitate the generation of parity information. This is because parity generation is often desirable prior to data being sent to multiple storage devices. For example, if a storage device should break down, then parity information can be used to re-create the data from the broken storage device.

Figure 2:
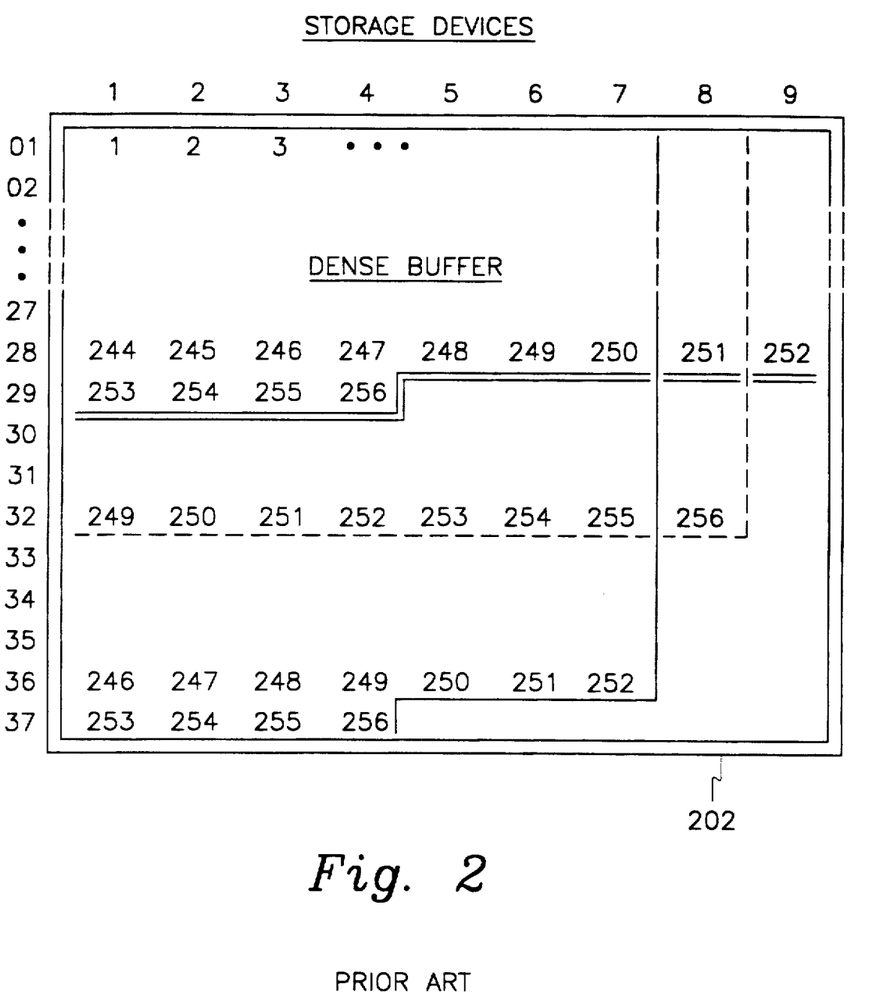
FIG. 2 is a diagram of a dense buffer.

One way that the striper 104 can be designed is with the use of a large "dense" buffer 202, as shown in FIG. 2. The example shown by FIG. 2 contemplates that data will be written to either 7, 8 or 9 storage devices. Each column in the dense buffer 202 corresponds to one of the multiple storage devices 106 (and the data in each column is to be written to its corresponding storage devices). Thus, if only seven storage devices are used, only 7 columns will be filled with data. Since 9 is the maximum number of storage devices, the dense buffer 202 in this example is 9 columns deep.

A storage facility 108 often receives data in "burst", consisting of some number of bytes. The dense buffer example of FIG. 2 depicts receipt of a burst containing 256 bytes. Where 9 storage devices are used, the entire burst fills the dense buffer 202 until row 29, column 4.

The fact that the data does not fill an entire row causes difficulties when the data is sent to the storage devices 106. For example, the data would be sent unevenly to the storage devices 106, and parity across the last stripe would be difficult to obtain where 7 or 9 storage devices were used. To alleviate this problem, parity generation would either have to be done on an incomplete row, or the next burst of data would have to begin in a column other than column 1. Further, if only certain sections of the burst were allowed in to promote alignment (for example, 252 bytes if 9 or 7 storage devices were used, and 256 bytes if 8 were used), a complex addressing scheme would be needed to keep track of the amount of data that should be allowed to enter the dense buffer 202.

Regardless of whether the data is aligned, a dense buffer 202 would require a relatively complex addressing scheme to keep track of the specific sections of the dense buffer 202 data should be written to, and read from. In addition, a significant amount of storage of the dense buffer 202 is wasted. In the example shown by FIG. 2, 86 bytes will always be unused, regardless of the number of storage devices 106 selected. Also, if the dense buffer 202 is a RAM, then timing and addressing considerations must also be taken into account.

Another desired feature in a striper would be the use of multiple identical chips. This is because it is often difficult or undesirable to use a single chip due to the limited number of I/O ports which may be available on a single chip. In addition, use of a single chip may cause problems if many signals within the chip are switched simultaneously.

Thus, what is needed is a way to stripe data and accommodate a variable number of storage devices without the need for the complex addressing schemes when using dense buffers such as a RAM. Such a device should facilitate the generation of parity data, and conserve space (that is, use a minimal amount of buffering).

SUMMARY OF THE INVENTION

The problems with the methodologies discussed above have been alleviated by the present invention. In general, the present invention provides a system and method for striping data to multiple storage devices. More specifically, the present invention provides a system and method for striping data to a variable number of storage devices such that parity generation can be facilitated, and such that a minimal amount of buffering is required.

One embodiment of the present invention contemplates that data from a data bus is split up (that is, striped) amongst several buffers. A buffer selection control is envisioned to induce these buffers to gate in data in a sequential fashion. Each buffer corresponds to a storage device, and thus only those buffers corresponding to storage devices in use would be induced to gate in data. A number of buffers corresponding to the maximum number of storage devices contemplated for use (not including any storage device which may be used to store parity information) must consequently be present.

When the buffers are detected to be full, then a transfer control transfers the data in these buffers in parallel to their appropriate storage devices. In this way, the present invention provides the flexibility to be used with a variable number of storage devices, while also transferring data in a manner which facilitates the generation of parity information. In addition, the use of several smaller buffers rather than one large buffering scheme significantly reduces the amount of buffer memory required, such that a minimal amount of buffering can be used.

Another embodiment of the present invention is a method which contemplates receiving the number of storage devices which are to be used, and sequentially selecting a buffer. The buffer would be selected from a plurality of buffers, each corresponding to a storage device to be used. Thus, if there are four storage devices to be used, then four buffers would be sequentially selected, beginning with the first buffer in the sequence.

Data is gated from the data bus into the buffer which has been selected, forming buffered data. Once data has been gated into the selected buffer, the next buffer in the sequence is selected, and data is gated into it. This gating of data and selecting of the next buffer in sequence is repeated until the buffers are full, or until no more data is sent from the data bus. When this occurs, the buffered data is transferred, in parallel, to the storage devices in use.

Alternative embodiments of both embodiments discussed above further contemplate the use of two or more striping buffers, each containing a number of buffers corresponding to the maximum number of storage devices contemplated for use. It is further contemplated that one or more of these striping buffers be selected for input, concurrently with the remaining striping buffers being selected for output. In this way, it is envisioned that those buffers within the striping buffers selected for input would be gating in data in the sequential fashion discussed above, concurrently with those buffers within the striping buffers selected for output transferring data to the storage devices in use. This embodiment would enhance the throughput of data.

It should be understood that the embodiments noted above can be implemented as both hardware and software embodiments, or a combination thereof.

BRIEF DESCRIPTION OF THE DRAWINGS

Various objects, features, and attendant advantages of the present invention can be more fully appreciated as the same become better understood with reference to the following detailed description of the present invention when considered in connection with the accompanying drawings, in which.

DETAILED DESCRIPTION OF THE DISCLOSURE

1. Overview

The present invention is a system and method for striping data to multiple storage devices. More specifically, this invention relates to a system and method for striping data to a variable number of storage devices, such that parity generation can be facilitated, and such that a minimal amount of buffering is used. Other advantages provided by the present invention are also set forth below. An overview of the present invention can be better explained with reference to FIG. 3.

Figure 3:
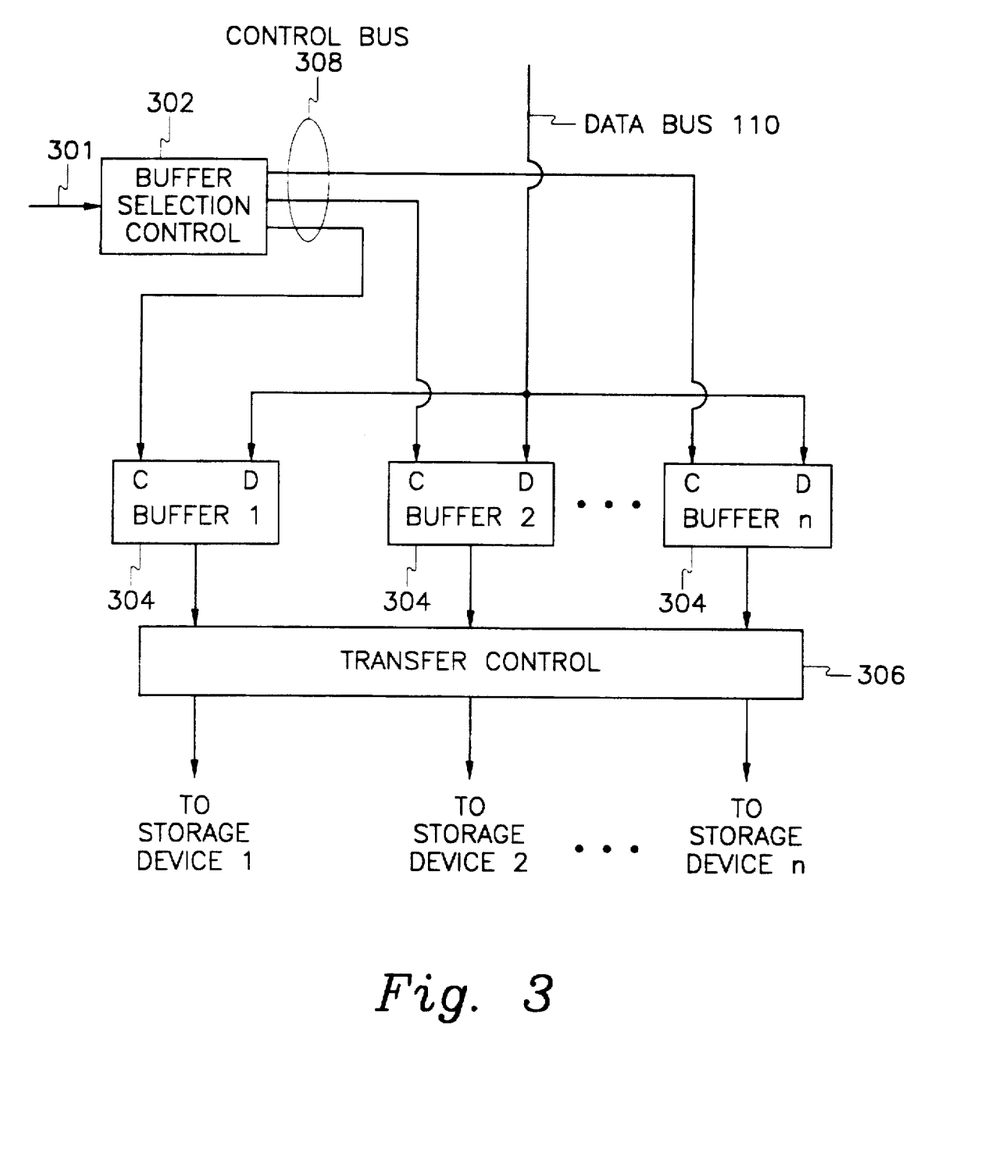
FIG. 3 is a high-level block diagram of embodiments of the present invention.

Referring now to FIG. 3, embodiments of the present invention are shown having a buffer selection control 302, n buffers 304, and a transfer control 306. A data bus 110 is used to send data from a data generating device such as a host computer 102, to the n buffers 304. In embodiments of the present invention, the number of buffers should be equal to the maximum number of storage devices that may be used (not including any storage device which may be used to store parity information). For example, if a given environment used with the present invention provides that a maximum of nine storage devices may be used, then nine buffers should be provided.

Further to the discussion above, embodiments of the present invention envision that each buffer actually corresponds to one of the storage devices 106. That is, the data which is gated into buffer x will be sent to storage device x. This being the case, only those buffers corresponding to storage devices in use are induced to gate in data.

When data is sent to the present invention (via data bus 110) to be striped, a buffer selection control 302 expects to receive an indication 303 of the number of storage devices that are to be used. The buffer selection control 302 then sends signals to the buffers 304 causing them to sequentially gate in sections of data from the data bus 110. These signals are sent via a control bus 308. Only those buffers 304 which correspond to storage devices in use are "selected" to gate in data.

An example of the above-mentioned sequential gating is described below. The buffer selection control 302 first sends a signal to buffer 1, to gate in a section of data (for example, 1 byte. It should be noted that embodiments of the present invention contemplate that the size of a "section" gated into a buffer are equal to the width of the data bus 110). Buffer selection control 302 then sends a signal to buffer 2 to gate in the next section of data, and so forth, until all buffers corresponding to a storage device in use have gated in a section of data. If the buffers 304 are not yet full, then embodiments of the present invention contemplate that buffer selection control 302 induces buffer 1 to gate in data, and the sequence begins anew.

The sequence described above continues until the buffers 304 corresponding to the storage devices 106 in use are full, or until there is no more data sent from the data bus 110. Either of these occurrences are detected by the buffer selection control 302. When either occurrence transpires, a transfer control 306 then sends the buffered data within buffers 304 to their associated storage devices 106. In this way, the data from data bus 110 will be transferred to the storage devices 106 in a "striped fashion" (that is, it is transferred across all the storage devices 106 in use).

If it is desired that the data be read back from the storage devices 106, the strategy described above can be reversed. That is, data can be read from each storage device and sent to its corresponding buffer. Once each buffer is full (or no more data is to be read from the storage devices), the data is then sequentially gated back out to the data bus 110.

It should be noted that the embodiments of the present invention noted above do not require the use of complex addressing schemes to keep track of the arrangement of the data within the buffers 304 as was needed for the large dense buffer described in the Background section. In addition, the use of a plurality of small buffers wastes less buffer space than the use of a large dense buffer as described in the Background section above. In fact, where the maximum number of storage devices 106 contemplated for use with an environment of the present invention are used, no buffer space is wasted at all. Also, the output of data in parallel to the storage devices 106 facilitates the generation of parity from each stripe.

Figure 4:
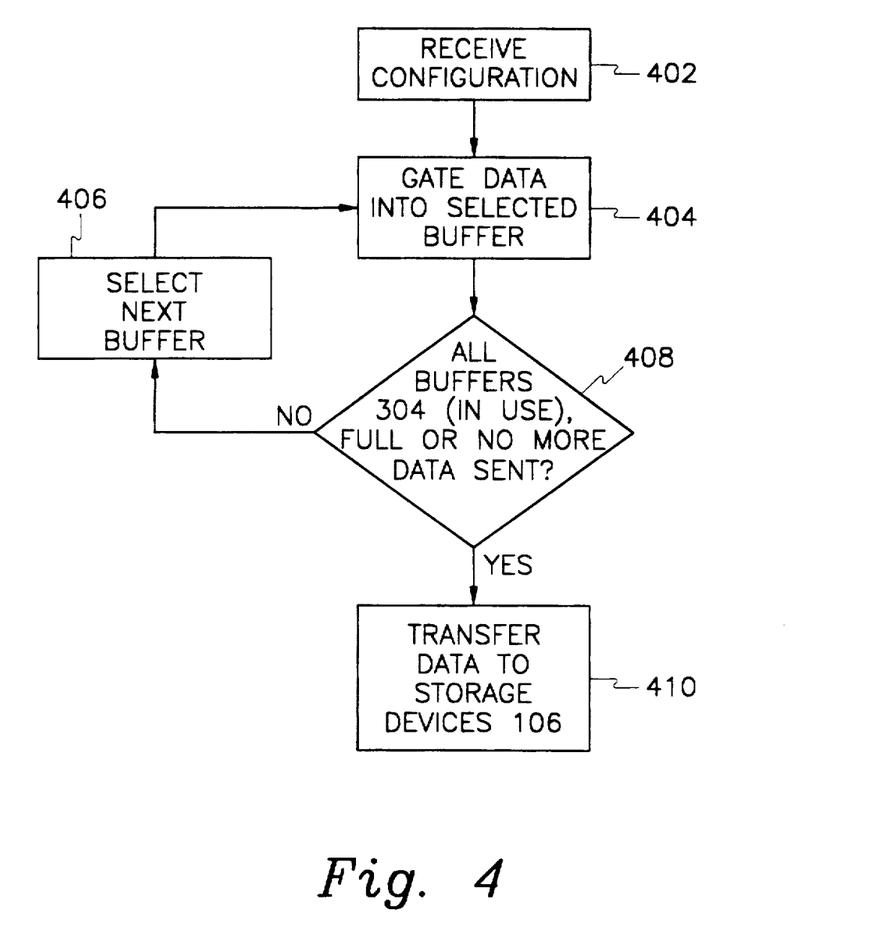
FIG. 4 is a high-level flow diagram of a method contemplated by embodiments of the present invention.

Embodiments of a method of operation of the present invention are described using the flowchart of FIG. 4. Referring to FIG. 4, the configuration of the environment contemplated for use with the present invention is first received, as indicated by a block 402. By "configuration," what is meant is the number of storage devices 106 that are to be used.

Once the number of storage devices 106 has been determined, a section of data is gated into the selected buffer, as indicated by a block 404. At the beginning of this process, the first buffer to gate in data is contemplated to be buffer number 1.

Once some section of data has been gated into a buffer, the present invention checks whether those buffers 304 which are in use are full, or whether no more data is being sent via the data bus 110. This is indicated by a decision block 408. It should be noted that if the present invention is sending data to eight storage devices, only eight buffers will be checked.

If all of the buffers are not full and data is still being sent via data bus 110, the present invention will then select the next buffer in the sequence to gate in data, as indicated by a block 406. The next section of data is then gated into that selected buffer, as indicated by block 404.

When all of the buffers which are in use become full (or no more data is sent via data bus 110), the data is then transferred to the appropriate storage devices 106, as indicated by decision block 408 and a block 410.

By allowing striped data to be transferred to the storage devices 106 in parallel as described above, the present invention facilitates the generation of parity data across the entire stripe. In other words, the sending of sections of data in parallel to various storage devices allows for parity to be generated using those sections of data transferred to the storage devices 106 at any given time.

II. Dual Striping Buffer Embodiments Using Registers

Figure 5:
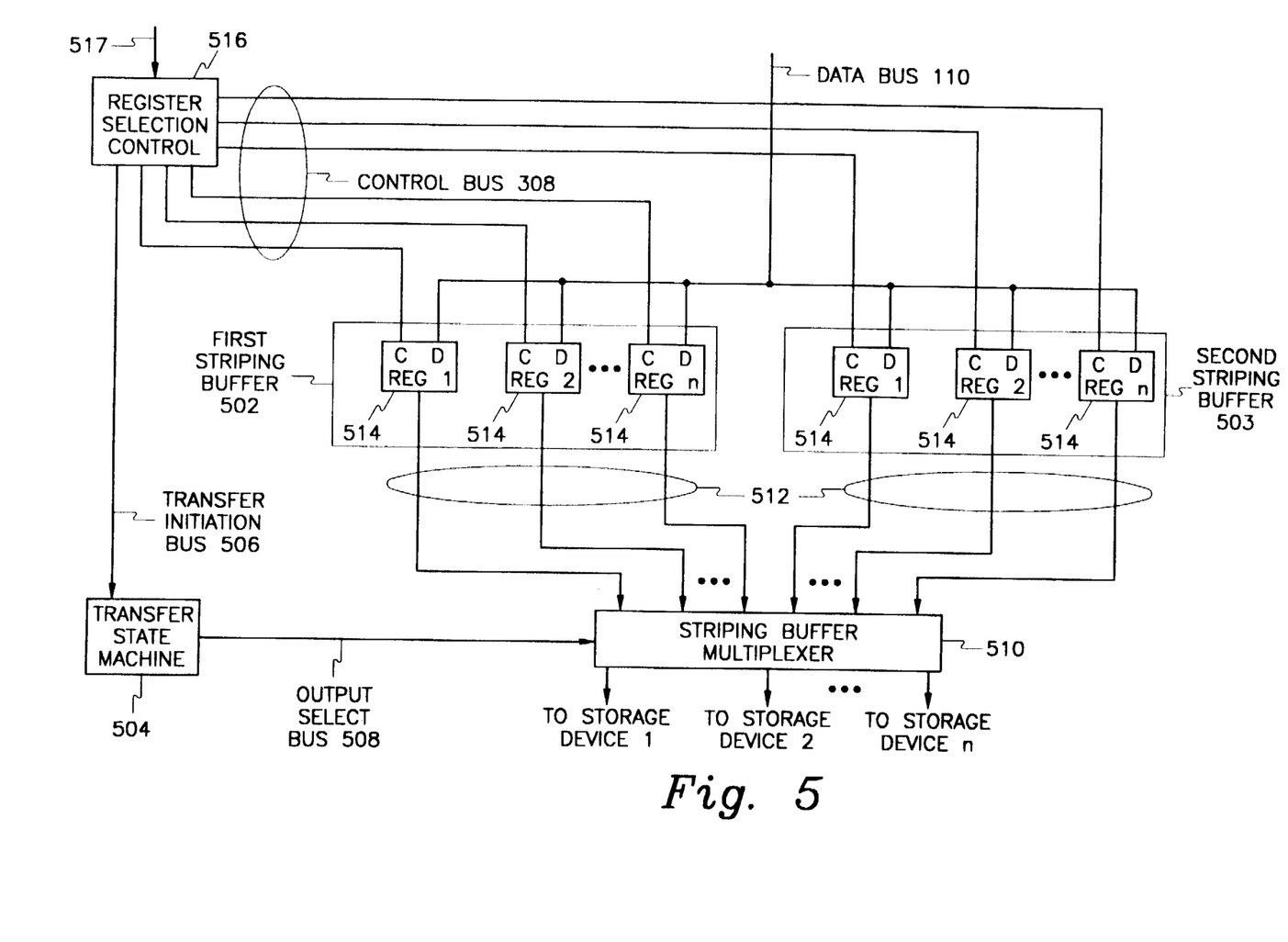
FIG. 5 is a block diagram of embodiments of the present invention having dual striping buffers.

In addition to the embodiments described above, the present invention also provides for embodiments where the buffers 304 are specifically implemented as registers 514, as shown by FIG. 5. Using registers such as those comprising polarity-hold flip-flops, timing and addressing concerns are minimized.

Other embodiments contemplated by the present invention employ a dual buffering scheme, using "striping buffers." In essence, this scheme allows one striping buffer (which consists of n registers) to gate in data from a data bus 110 at the same time that another striping buffer (also consisting of n registers) is sending data to the storage devices 106. The striping buffers alternate between gating in data, and transferring the data to the storage devices 106. This allows for a faster throughput of data. These embodiments are considered in greater detail with regard to FIG. 5.

Referring now to FIG. 5, a first striping buffer 502 and a second striping buffer 503 are shown to each contain n registers 514. In embodiments of the present invention, each striping buffer contains a number of registers equal to the maximum number of storage devices 106 which are contemplated for use with a given environment of the present invention. Thus, as with the embodiments discussed regarding FIG. 3, if the maximum number of storage devices 106 that may be used is nine, then the first striping buffer 502 and the second striping buffer 503 would each contain nine registers.

As with the previous embodiments regarding FIG. 3, when data is sent via data bus 110, a register selection control 516 receives information 517 regarding the number of storage devices 106 that are contemplated for use with the particular environment in which the present invention is being used. However, the embodiments of FIG. 5 further provide that data is gated first to registers 514 in the first striping buffer 502, and then to registers 514 in the second striping buffer 503. The data is gated to one or the other striping buffer until all the registers 514 in that striping buffer are full (or until no more data is sent via data bus 110).

Thus, register selection control 516 first induces data to be gated into the registers 514 of the first striping buffer 502 in the sequential manner discussed above (regarding FIG. 3) until each of these registers 514 is full. In embodiments of the present invention, the register selection control 516 keeps track of the amount of data that was written to each of the registers 514. Since it is also aware of the capacity of the registers 514 and the number of registers 514 being used at any given time, it detects when all of the registers 514 in the first striping buffer 502 are full.

When the registers 514 in the first striping buffer 502 are detected as full (or when no more data is sent via data bus 110), the data within these registers is transferred to the appropriate storage devices 106. This is accomplished by the register selection control 516 sending a signal across a transfer initiation bus 506 to a transfer state machine 504. Transfer state machine 504 then sends a signal across output select bus 508 to a striping buffer multiplexer 510. This signal indicates which of the striping buffers is to send data to the storage devices 106.

In the situation described above, since the first striping buffer 502 is full, the striping buffer multiplexer 510 will cause the data in the registers 514 of the first striping buffer 502 to be transferred to the storage devices 106. This data is sent to the striping multiplexer 510 via data-out bus 512.

At the same time that data is being sent from the first striping buffer 502 to the storage devices 106, the register selection control 516 sends signals across control bus 308 to induce registers 514 within the second striping buffer 503 to gate in data. When the second striping buffer 503 is full, the data is transferred to the storage devices 106 in the same way as described above. While this transfer occurs, register selection control 516 induces the registers 514 in the first striping buffer 502 to gate in data from the data bus 110.

In essence, while one of the striping buffers receives data, the other one simultaneously sends data to the storage devices 106. While only two striping buffers are shown, it should be understood that a greater number of striping buffers can also be used in a sequential fashion. It should also be understood that the sequence described above can begin with a striping buffer other than the first striping buffer 502.

Figure 6:
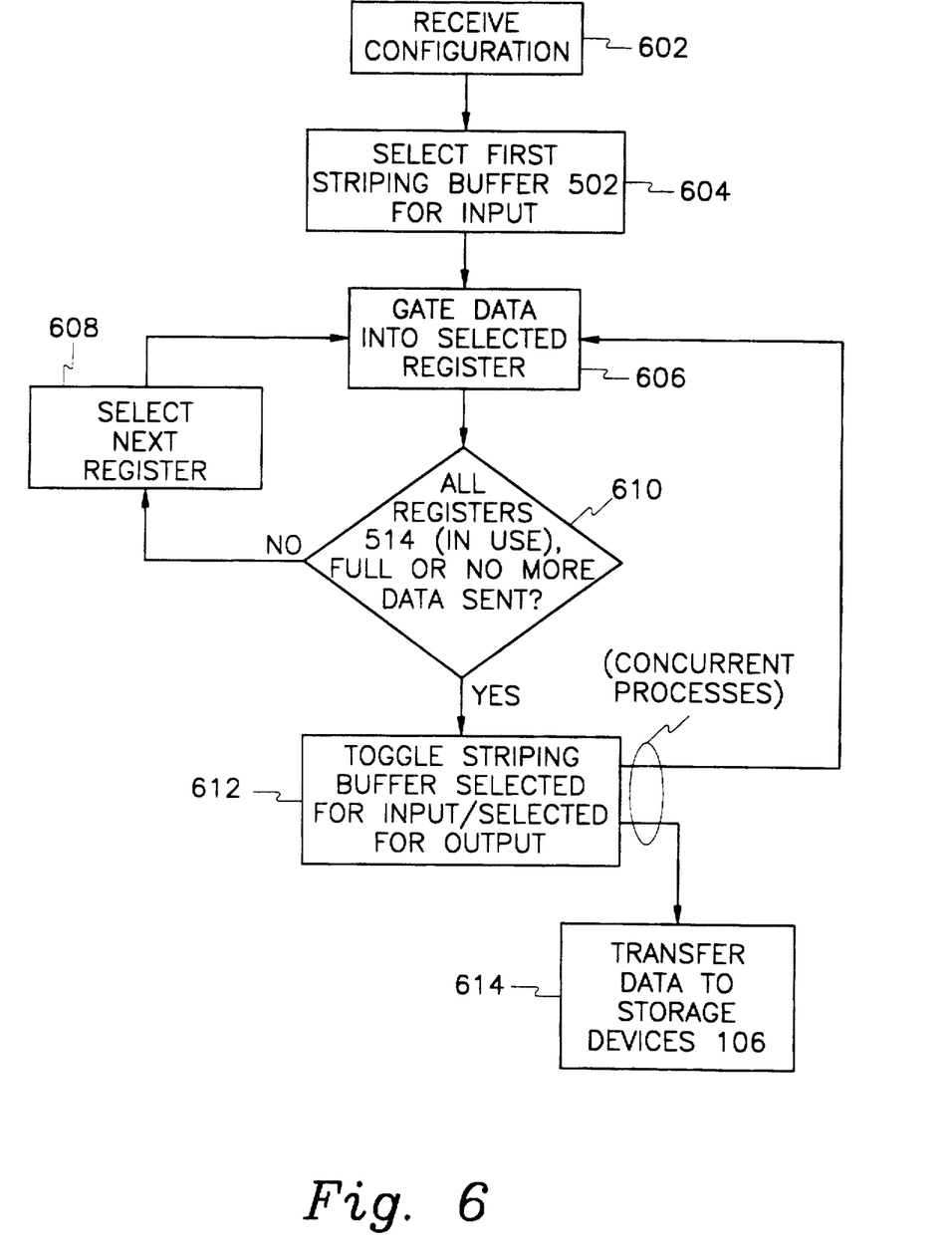
FIG. 6 is a flow diagram of a method contemplated by embodiments of the present invention where dual striping buffers are used.

Embodiments of a method of operation of the present invention are described using the flowchart of FIG. 6. Referring now to FIG. 6, the configuration of the storage devices 106 is received, as indicated by a block 602. The first striping buffer 502 is then selected as the striping buffer which is to first receive data, as indicated by a block 604. Data is then gated into a selected register, as indicated by a block 606. In embodiments of the present invention, the first register selected is register 1 within the first striping buffer 502.

Next, the present invention determines whether all of the registers 514 in use (in the striping buffer selected for input) are full, or whether no more data is sent via data bus 110. This is indicated by a decision block 610. If the answer to both these queries is "no", the present invention will then select the next register (within the striping buffer selected for input) as indicated by a block 608. This process will repeat itself until all of the registers (within the striping buffer selected for input) are full, or until no more data is sent via data bus 110.

When all of the registers 514 (within the striping buffer selected for input) are full or no more data is sent, whichever striping buffer is selected for input is toggled to be selected for output, and vice versa. This is indicated by a block 612. Thus, if the first striping buffer 502 is selected for input and the second striping buffer 503 is selected for output, this selection will be reversed. In other words, where the second striping buffer 503 was previously selected for output, it is then selected for input.

After a striping buffer is selected for output, the data in its registers 514 is transferred to the appropriate storage devices 106 as indicated by a block 614. Concurrently with this transfer of data, the striping buffer which has just been selected for input receives data into its registers 514, as indicated by blocks 606, 608, and 610. This process of alternating striping buffers for input and output continues until no more data is sent via data bus 110.

Although FIG. 5 is shown utilizing registers, it should be understood that the embodiments described above regarding FIG. 5 could also be implemented using multiple buffers other than registers.

Figure 7:
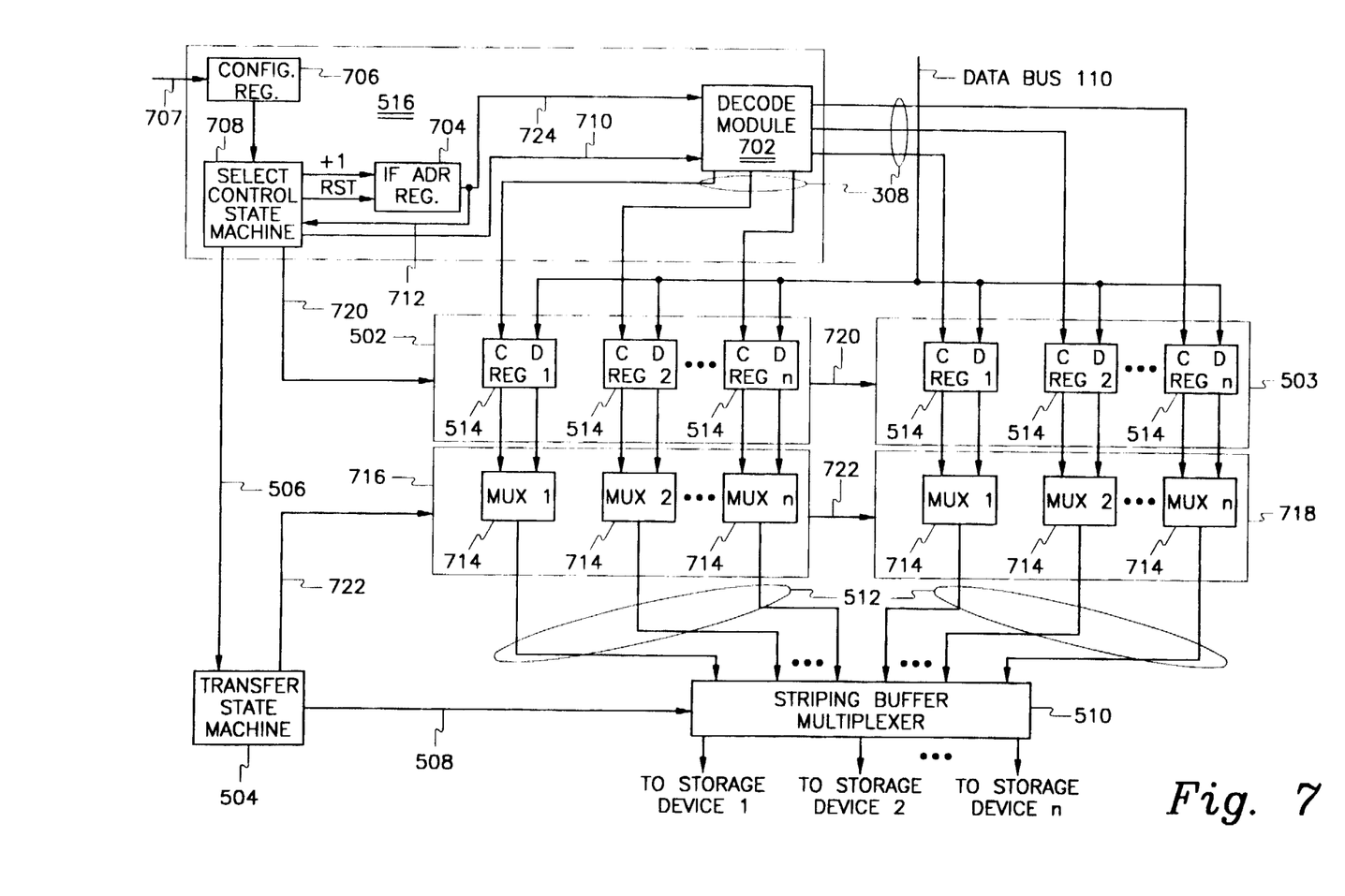
FIG. 7 is a block diagram of embodiments of the present invention having dual-cycle registers.

III. Register Selection Control Components and Dual-Cycle Register Embodiment A more detailed view of the register selection control 516 as contemplated by embodiments of the present invention are discussed with regard to FIG. 7. Referring now to FIG. 7, register selection control 516 is shown to comprise a configuration register 706, a select control state machine 708, an interface address register 704 (abbreviated IF ADR REG), and a decode module 702.

The configuration register 706 receives from some external control mechanism (not shown) information 707 concerning the number of storage devices 106 which are to be used. This information is used by the select control state machine 708.

The select control state machine 708 controls the state of the present invention. For example, it controls which of the registers 514 data is to be gated into, and also keeps track of whether the registers 514 in the striping buffer selected for input are full.

The actual address of the register into which data is to be gated is generated by the IF ADR REG. When the first register of either of the striping buffers is to gate in data, a reset signal (RST) is sent to IF ADR REG 704. The control state machine 708 sends a high signal (+1) to the IF ADR REG 704 each time the data is to be gated in by the next register in the sequence.

The output of IF ADR REG 704 is sent via line 712 back into select control state machine 708 so that it can keep track of which register is presently selected to gate in data. The output of IF ADR REG 704 is also sent to a decode module 702. The decode module 702 is also receptive to a buffer select line 710 which indicates to the decode module 702 which of the striping buffers (502 or 503) has been selected for input.

The combination of signals received by the decode module 702 from register address line 724 and buffer select line 710 indicate to the decode module 702 exactly which of the registers should gate in data. Upon receipt of these signals, the decode module 702 then sends signals via control bus 308 to the selected register to gate in data.

Some embodiments of the present invention contemplate that each register 514 is addressable by some fraction (such as a word or a byte) of its total data capacity. In this way, data can be gated into these registers so that each register is selected in multiple iterations to gate in a small amount of data until all of the registers are filled. Other embodiments contemplate that each time data is gated into a register, that register is filled to its data capacity. Thus, multiple iterations are not always necessary. These latter embodiments require that the decode module 702 have less addressing capabilities, although the former embodiments may be advantageous where the width of data bus 110 is relatively small (for example, one byte or serial transmission), and the data rate from the data bus 110 is very fast.

In addition to the use of the control bus 308 which indicates which register should gate in data, embodiments of the present invention also contemplate the use of a data-in gate line 720. The data-in gate line 720 is used as a timing signal to actually cause a selected register to gate in the data.

When transferring striped data to multiple storage devices 106 in parallel, problems can occur when attempting to switch a large number of signals simultaneously. These problems may include the generation of unwanted noise due to inductance. Embodiments of the present invention alleviate this simultaneous switching problem by staggering the transfer of data to the storage devices 106, while still maintaining the advantages discussed above. The embodiments of the present invention that address those problem are explained with regard to FIG. 7.

Referring again to FIG. 7, the concept of using alternating striping buffers is again shown. In addition, FIG. 7 also shows embodiments which use a first multiplexer set 716 and a second multiplexer set 718. These multiplexer sets corresponding to first striping buffer 502 and second striping buffer 503, respectively. Within each multiplexer set is a series of multiplexers 714. In embodiments of the present invention, the number of multiplexers 714 correspond to the number of registers 514.

When the registers 514 in a striping buffer are selected for output (because they are full or because there is no more data from data bus 110), half of the data from each register 514 in the striping buffer is transferred first. Thus, each register is used in a dual-cycle mode. This helps to decrease the amount of simultaneous switching which would otherwise occur if all of the data from the registers 514 of the striping buffer was transferred to the storage devices 106 at once.

To implement the above-noted concept, embodiments of the present invention envision that a transfer half-select line 722 be used to indicate which part of the registers 514 in the striping buffer selected for output is to transfer data. Thus, the multiplexers 714 act as valves, opening the first half of each register 514, and then the second half. As with the embodiments discussed regarding FIG. 5, the striping buffer multiplexer 510 allows only data from the registers 514 in the striping buffer selected for output to be transferred to the storage devices 106.

Thus, in the above-noted embodiments, the multiplexers 714 allow for the transfer of data first from the first half of the registers 514, and then from the second half. It should be understood, however, that the registers 514 could each be divided by the multiplexers 714 into a greater number of portions than two.

Figure 8:
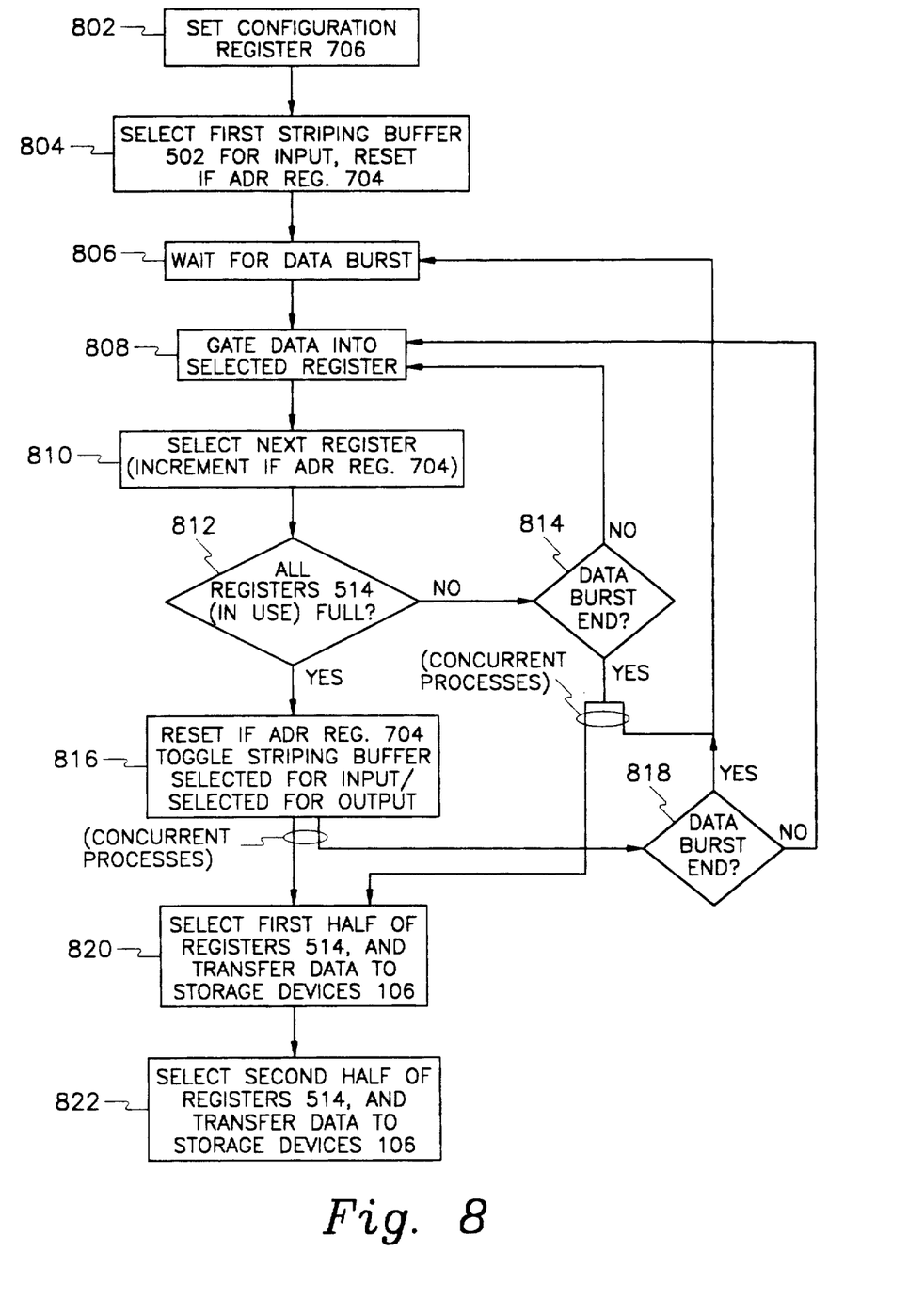
FIG. 8 is a flow diagram of a method contemplated by embodiments of the present invention where dual-cycle registers are used.

Embodiments of a method of operation of the present invention are described using the flowchart of FIG. 8. Referring to FIG. 8, the configuration register 706 is first set, as indicated by a block 802. First striping buffer 502 is selected for input, and the IF ADR REG 704 is reset, as indicated by a block 804.

As indicated in the Background section above, data is often received via data bus 110 in bursts. Thus, in embodiments of the present, a data burst is waited for, as indicated by a block 806.

Once a data burst has begun, data is gated into the selected register, as indicated by a block 808. When this process begins, the first register is envisioned to be register 1 in the first striping buffer.

In embodiments of the present invention, the next step entails selecting the next register which is to gate in data. This is done by incrementing the IF ADR REG 704, as indicated by a block 810. The present invention then determines whether all registers 514 in the striping buffer selected for input, which are in use, are full. This is indicated by a decision block 812. If all these registers 514 are not full, and the data burst has not ended, then data will be gated into the selected register, as indicated by a decision block 814 and block 808.

If, however, the registers 514 (in the striping buffer selected for input) are not full but the burst has ended, then the data should be transferred to the storage devices 106. This is because there is no more data to be received via data bus 110. Consequently, the present invention will again wait for a data burst 806 while concurrently transferring data to storage devices 106.

It should be noted that in some embodiments of the present invention, the process will simply discontinue rather than wait for another data burst as indicated above. In addition, some embodiments of the present invention contemplate an environment where the data is received via data channel 110 in a steady stream. In such a situation, the process discussed regarding FIG. 8 would be continuous, in that there would be no need to wait for a data burst.

Regarding the concurrent transfer of data to the storage devices 106, the first half of the registers 514 are selected, and the data from the registers 514 in the striping buffer selected for output is transferred to storage devices 106. This is shown by a block 820. Then, the second half of the registers 514 are selected, and the data in that second half is transferred to the storage devices 106, as shown by a block 822. Although the data in these embodiments has not been transferred totally in parallel to the storage devices 106, it is nonetheless done substantially simultaneously so as to facilitate the generation of parity information.

Referring back to decision block 812, if all of the registers 514 are full, then the IF ADR REG 704 is reset, and the status of the striping buffers are toggled (that is, the striping buffer previously selected for input is now selected for output, and vice versa), as indicated by a block 816. The data in the registers 514 of the striping buffer selected for output are transferred to the storage devices 106, as indicated by blocks 820 and 822.

Concurrently with the actions occurring as per blocks 820 and 822, the present invention checks to see if the data burst has ended, as indicated by a decision block 818. This situation would occur if all the registers 514 in the striping buffer selected for input had filled when the data received from the data bus 110 had ceased.

If the present invention determines that the data burst had in fact ended, it then waits for another data burst, as indicated by block 806. If the burst has not ended, then data is gated into the selected register, as indicated by block 808. In embodiments of the present invention, this selected register would be the first register in the striping buffer selected for input.

IV. Specific Advantages and Embodiments

Specific embodiments contemplated by the present invention include that the data bus 110 consists of two data lines, each one being four bytes wide. Thus, the present invention receives eight bytes simultaneously.

Some of these embodiments also contemplate that each register has a capacity of eight bytes. In this way, when each of the eight bytes that simultaneously arrive via the data bus 110 are gated into the selected register, the data fills the register to capacity. No multiple iterative selection of registers 514 for input would thus be necessary.

In some embodiments of the embodiments discussed above, the registers 514 are only "logical" registers, and are each physically divided evenly amongst four striper chips. That is, if each logical register has eight bytes, then one-fourth of each register (that is two bytes) can be found on each chip. This is done to further reduce simultaneous switching.

Figure 9A:
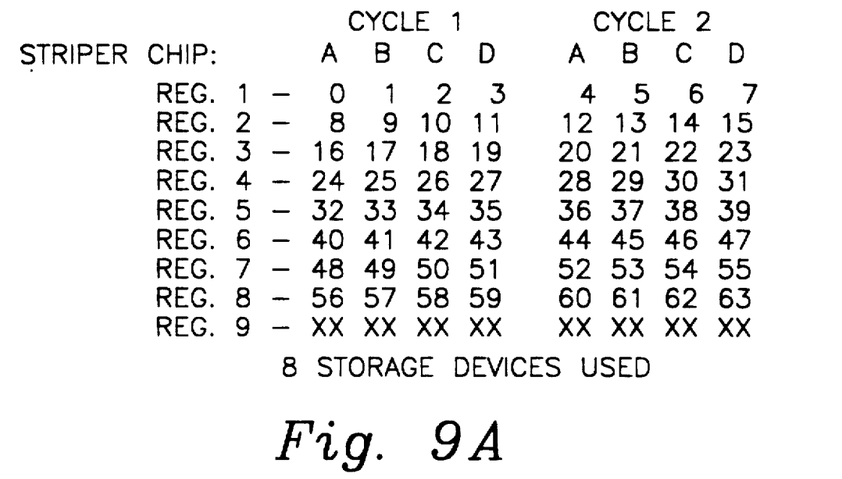
FIGS. 9a and 9b are diagrams showing how data stored in registers are divided among several striper chips in various embodiments.
Figure 9B:
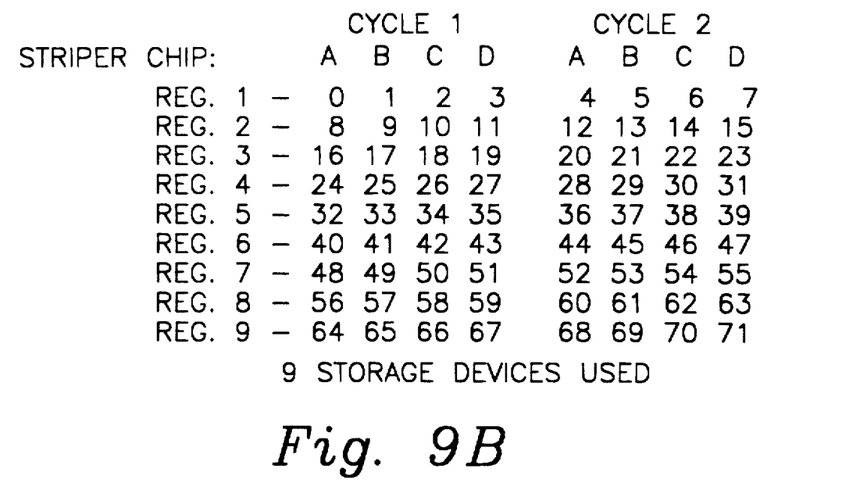

The organization and transfer of data for the above-noted embodiments can be better explained with regard to FIGS. 9a and 9b. The data shown in both of these figures represents data from a single striping buffer.

Referring first to FIG. 9b, it is contemplated that nine storage devices are being used. Consequently, nine registers are being used.

As can be seen, the first eight bytes are placed into register one. Again, this is because eight bytes were sent via the data bus 110 simultaneously (in other words, the data bus 110 in this embodiment is eight bytes wide). Register 2 then gets the next eight bytes, and so on.

In embodiments where the data bus 110 were of a width smaller than the capacity of each of the registers, the data could be distributed to the registers using multiple iterations as discussed with reference to the previous Figures. In addition, it is also envisioned in these embodiments that each register be filled to its capacity before selecting the next register for input.

Although the data may be placed on logical registers, the data physically resides on striper chips as indicated above. In embodiments shown by FIG. 9b, striper chip A would contain bytes 0 and 4 from logical register 1, striper chip B would contain bytes 1 and 5, etc. When the data is to be transferred to the storage devices 106, those bytes designated "cycle one" are transferred first using the multiplexer arrangement described above, and those bytes designated "cycle two", are transferred thereafter. In this way, half of the data in the logical registers are effectively transferred during cycle one, with the remaining data transferred during cycle two.

FIG. 9a is the same as 9b, except that only eight storage devices are contemplated for use. Thus, no data is sent to register 9, as indicated by this figure.

It has been indicated above that the registers 514 used comprise polarity-hold flip-flops. However, it should be understood that registers comprising other types of flip-flops could also be used. Various types of RAMs such as dual-port RAMs could also be used.

Embodiments of the present invention contemplate that the logic governing the present invention be controlled by ASIC VLSI technology. Also, it is contemplated that multiple identical chips be used. For example, embodiments of the present invention contemplate that each component be split evenly amongst four identical chips operating in harmony with one another. This extends the concept of using four striper chips each having a portion of each register (as discussed above) to using four chips having a portion of all the components used in the present invention.

It should be understood that the present invention can be implemented in software embodiments. In such embodiments, the various components and steps would be implemented in software to perform the functions of the present invention. Any presently available or future developed computer software language can be employed in such software embodiments of the present invention.

It should further be understood that present invention is not limited to the embodiments indicated above, and that the examples presented above are merely f or the purposes of illustration. The scope of the present invention should therefore be interpreted by the following claims as defined by the forgoing figures and text.

What is claimed is:

1. A method for striping data from a data bus to a variable number of storage devices, comprising the steps of:
   (1) receiving a signal indicating the number of storage devices to be used, wherein said signal is sent by an external source;
   (2) sequentially selecting, by a buffer selection means, a buffer from a plurality of buffers in response to said received signal, each of said plurality of buffers corresponding to a storage device to be used;
   (3) striping data from the data bus through a striping means into said selected buffer of said step (2), so as to form buffered data;
   (4) repeating said steps (2) and (3) until each of said plurality of buffers of said step (2) are full of data, or until no more data is sent for input from the data bus; and
   (5) transferring, by a transferring means, in parallel, at least a portion of said buffered data from said plurality of buffers of said step (2) to the storage devices, wherein said buffer selection means controls said striping means and said transfer means.

2. The method of claim 1, wherein said step (3) comprises a step of striping data equal to the capacity of said selected buffer.

3. The method of claim 1, wherein said step (2) further comprises a step of using a plurality of registers as said plurality of buffers.

4. The method of claim 1, wherein said step (3) further comprises a step of individually addressing fractions of each of said plurality of buffers.

5. A method for striping data from a data bus to a variable number of storage devices, comprising the steps of:
   (1) receiving a signal indicating the number of storage devices to be used, wherein said signal is sent by an external source;
   (2) selecting from a plurality of striping buffers, one or more striping buffers for input, and one or more striping buffers for output according to said received signal, each of said striping buffers comprising a plurality of buffers, wherein a buffer selection means selects said striping buffers for input and output;
   (3) sequentially selecting one of said plurality of buffers from said one or more striping buffers for input;
   (4) striping data from the data bus through a striping means into one of said striping buffers for input of said step (2), so as to form buffered data;
   (5) repeating said steps (3) and (4) until each of said plurality of buffers of said step (2) are full of data, or until no more data is sent for input from the data bus;
   (6) toggling said plurality of striping buffers, wherein said one or more striping buffers selected for input are selected for output, and said one or more striping buffers selected for output are selected for input; and (7) transferring, by a transferring means, at least a portion of said buffered data from said plurality of buffers in said one or more striping buffers selected for output, concurrently with said steps (3)-(5), wherein said buffer selection means controls said striping means and said transfer means.

6. The method of claim 5, wherein said step (4) comprises a step of striping data equal to the capacity of said selected buffer.

7. The method of claim 5, wherein said step (3) comprises a step of using a plurality of registers as said plurality of butters.

8. The method of claim 5, wherein said step (4) comprises a step of individually addressing fractions of each of said plurality of buffers.

9. A system for striping data from a high speed data bus to a variable number of storage devices, the data on the data bus being grouped by data words, the system comprising:

first and second striping buffers each comprising a number of registers equal to a maximum number of storage devices to be used by the system, wherein said first and second striping buffers are configurable to use less than said maximum number of registers to store the data so that the number of registers used by said first and second striping buffers is equal to the number of storage devices currently being used by the system;

register selection control means, coupled to said first and second striping buffers, for receiving a signal from an external source indicating how many storage devices will be used by the system to store the data, and for controlling the number of registers used by said first and second striping buffers so that the number of registers used is equal to the number of storage devices currently being used by the system;

wherein said first and second striping buffer registers comprise a plurality of striper chips coupled to the data bus, for striping a group of the data words from the data bus at a high speed and storing one data word in each of said registers, wherein each of said striper chips stores two or more bytes of each data word of said group of the data words; and transfer means coupled to said plurality of striper chips and said register selection control means, for simultaneously transferring half of each data word from each of the registers to a corresponding one of the storage devices such that contents of said first and second striping buffers can be stored into the storage devices on an every-other cycle basis to reduce simultaneous switching of said striping buffers, and to enhance high speed throughput.

10. The system of claim 9, wherein said registers each have a data capacity equal to the width of the data bus.

11. The system of claim 9, wherein said transfer means comprises,
a transfer state machine, and
a striping buffer multiplexer.

* * * * *